United States Patent
Ishikawa et al.

(10) Patent No.: US 6,910,403 B1
(45) Date of Patent: Jun. 28, 2005

(54) METHOD FOR CUTTING SEMICONDUCTOR WAFER PROTECTING SHEET

(75) Inventors: Toshihiko Ishikawa, Mitaka (JP); Yasushi Katagiri, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 24 days.

(21) Appl. No.: 09/587,281

(22) Filed: Jun. 5, 2000

(30) Foreign Application Priority Data

Jun. 11, 1999 (JP) .............................. 11-164748

(51) Int. Cl.$^7$ .............................. H01L 21/304
(52) U.S. Cl. .................... 83/34; 125/11.15; 451/44
(58) Field of Search ............. 83/13, 34; 125/11.1, 125/11.15; 451/43, 44

(56) References Cited

U.S. PATENT DOCUMENTS

| | | | |
|---|---|---|---|
| 4,344,260 A | * | 8/1982 | Ogiwara ...................... 451/44 |
| 4,522,679 A | * | 6/1985 | Funakoshi et al. ........... 156/510 |
| 4,568,407 A | * | 2/1986 | Barbieri et al. .............. 156/510 |
| 4,638,601 A | * | 1/1987 | Steere et al. ............... 451/44 X |
| 4,925,515 A | * | 5/1990 | Yoshimura et al. ......... 156/250 |
| 5,117,590 A | * | 6/1992 | Kudo et al. .................... 451/44 |
| 5,295,331 A | * | 3/1994 | Honda et al. .................. 451/44 |
| 5,435,876 A | * | 7/1995 | Alfaro et al. ................ 156/247 |
| 5,514,025 A | * | 5/1996 | Hasegawa et al. ............. 451/44 |
| 5,580,831 A | * | 12/1996 | Roman ........................... 83/33 |
| 5,624,760 A | * | 4/1997 | Collins et al. ............. 451/44 X |
| 5,674,110 A | * | 10/1997 | Cuoghi ......................... 451/44 |
| 5,746,102 A | * | 5/1998 | Benzing, III et al. ........... 83/34 |
| 5,971,680 A | * | 10/1999 | Kuo ......................... 451/44 X |
| 6,080,263 A | * | 6/2000 | Saito et al. ................. 156/253 |
| 6,129,811 A | * | 10/2000 | McKenna et al. ........... 156/391 |
| 6,334,808 B1 | * | 1/2002 | Tanaka ......................... 451/42 |

* cited by examiner

Primary Examiner—Charles Goodman
(74) Attorney, Agent, or Firm—Nixon Peabody LLP; David S. Safran

(57) ABSTRACT

To cut a protecting sheet adhered over the obverse of a wafer, an inclination angle of a cutting tool is adjusted according to a form of a chamfered part of the wafer and a finishing thickness of the wafer so that the protecting sheet is cut into the required minimum size for protecting the obverse of the wafer. Thus, the protecting sheet is not included inside a removed portion in a grinding process of the reverse of the wafer with a grindstone even if the wafer is ground to have extremely thin finishing thickness. Hence, the protecting sheet is not ground while the reverse of the wafer is ground, and the grindstone is thus prevented from being clogged up with ground material of the protecting sheet.

1 Claim, 4 Drawing Sheets

F I G. 1
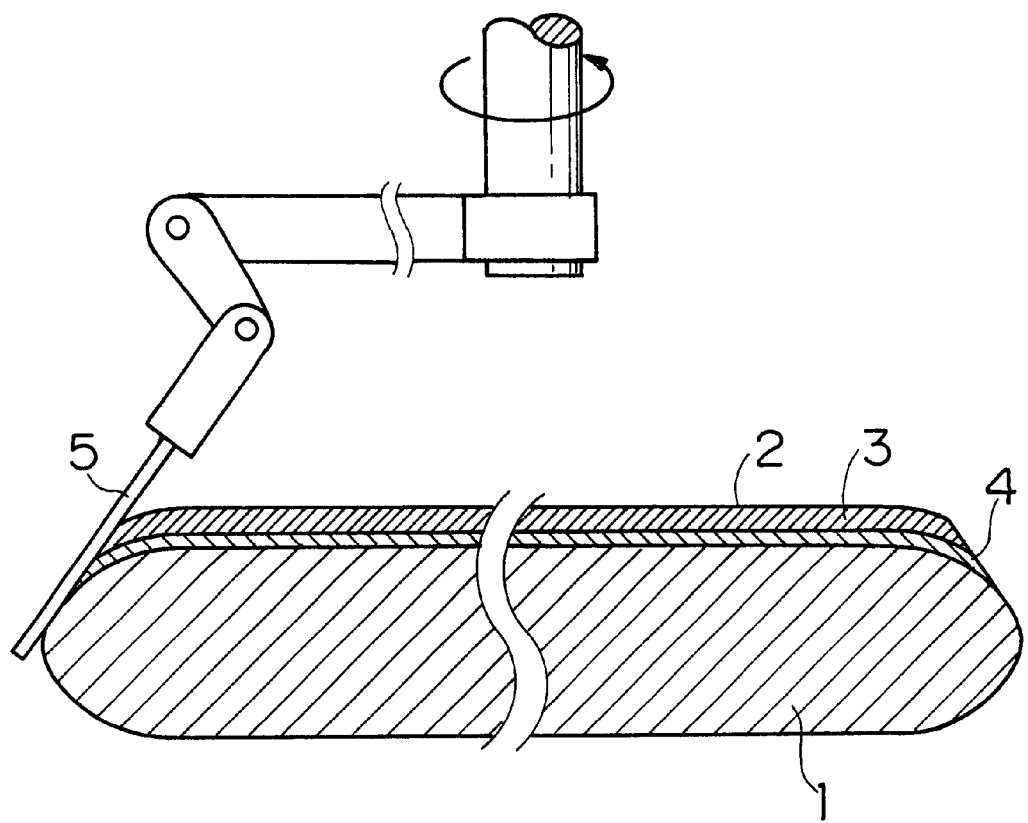

METHOD FOR CUTTING SEMICONDUCTOR WAFER PROTECTING SHEET

BACKGROUND OF THE INVENTION

1. Field of the Invention

The present invention relates generally to a method for cutting a wafer protecting sheet, particularly to a method for cutting an obverse protecting sheet that is used for a semiconductor wafer when machining with a back grinder and the like.

2. Description of Related Art

FIG. 4 is a sectional side view of a semiconductor wafer 1, on which a protecting sheet 2 is adhered and cut in a conventional cutting method. Semiconductor devices such as ICs are formed on the obverse of the wafer 1 and are individually inspected, and the wafer 1 is then diced with a dicing saw to separate devices. The semiconductor devices for IC cards and the like are required to be thin. In order to produce the devices of a desired thickness, the reverse of the wafer 1 is ground as shown in FIG. 5 with a back grinder (not shown) before the wafer 1 is diced into the separate devices with the dicing saw. FIG. 6 is a sectional side view of the semiconductor wafer 1 that has been ground as shown in FIG. 5.

Before the reverse of the wafer 1 is ground, the protecting sheet 2 is adhered on the obverse of the wafer 1 to protect the devices, which have been formed on the obverse. The protecting sheet 2 is composed of a plastic base 3 and an adhesive layer 4. The protecting sheet 2 is adhered to the obverse of the wafer 1 through the adhesive layer 4, and is then cut along the outer periphery of the wafer 1 with a cutting tool 5 as shown in FIG. 4.

The semiconductor wafer 1 can generate micro cracks and fragments during manufacturing processes if the edge at the periphery of the wafer 1 is sharp. Then, the micro cracks generated at the edge can develop toward the inside of the wafer 1 and the micro fragments can have a bad effect on the wafer 1, and the wafer 1 can be damaged as a result. In consideration of this, the edge portion at the outer periphery of the wafer 1 is chamfered beforehand to eliminate the sharp edge.

In a case to adhere the protecting sheet 2 on the obverse of the chamfered wafer 1, the protecting sheet is adhered not only to the level part of the obverse, but also to the chamfered inclined surface. Then, the protecting sheet 2 is conventionally cut with the cutting tool 5' in this state along the periphery of the wafer 1 at the right angle with respect to the level part of the obverse of the wafer 1 as shown in FIG. 4. The cut face and the level surface of the protecting sheet 2 form the right angle.

Then, the wafer 1 is mounted and fixed with the reverse up and the obverse, over which the protecting sheet 2 is adhered, down on a worktable (not shown) of the back grinder, and the reverse of the wafer 1 is ground with a grindstone (not shown) so that the wafer 1 becomes a predetermined thickness.

As an extremely thin IC card such as a smart card has been started, the semiconductor devices to be incorporated thereinto have been required to be extremely thin, 30 $\mu$m to 50 $\mu$m for example. In this case, the wafer 1 must be ground so that a finishing thickness is extremely thin, and more than half of the original thickness of the wafer 1 is removed as shown in FIG. 5, where a reference numeral 6 represents a portion that is ground and removed. At this time, not only the wafer 1 of brittle material but also the plastic base 3 and the adhesive layer 4 of the protecting sheet 2 are partly ground as shown in FIG. 5, and the ground plastic and adhesive material sticks on grinding particles (e.g. diamond particles) of the grindstone and thereby clogs up the grindstone. Then, machining performance is deteriorated, and machining efficiency and quality of the machined products are lowered; also, the wafer 1 is damaged.

SUMMARY OF THE INVENTION

The present invention has been developed in view of the above-described circumstance, and has as its object the provision of a method for cutting a protecting sheet to prevent the cut protecting sheet from being ground and from clogging up a grindstone even if the wafer is ground to have extremely thin finishing thickness.

In order to achieve the above-described object, the present invention is directed to a method for cutting a protecting sheet which covers a first face of a wafer, the first face being protected with the protecting sheet while an opposite face of the wafer being processed, wherein the protecting sheet is cut so that a diameter of the protecting sheet is at least a diameter of a level part of the first face of the wafer as well as smaller than an outer diameter of the wafer.

Preferably, a tool which cuts the protecting sheet is inclined so that a cut face of the protecting sheet and a level surface of the protecting sheet form an obtuse angle.

Preferably, an inclination angle of the tool is adjusted according to a form of a chamfered part of the wafer and a finishing thickness of the wafer.

According to the present invention, the protecting sheet is cut in a required minimum size for protecting the obverse of the wafer, so that the protecting sheet is not included inside a removed portion in a grinding process of the reverse of the wafer even if the wafer is ground to have extremely thin finishing thickness. Hence, the protecting sheet is not ground while the reverse of the wafer is ground, and the grindstone is thus prevented from being clogged up with ground material of the protecting sheet. Therefore, the problem in the conventional art that caused the deterioration of machining performance, lowered machining efficiency and quality, and further caused damaging of the wafer, can all be overcome.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a schematic section view showing a semiconductor wafer, on which a protecting sheet is adhered and cut in a cutting method according to an embodiment of the present invention;

DETAILED DESCRIPTION OF THE PREFERRED EMBODIMENT

Figure 2:
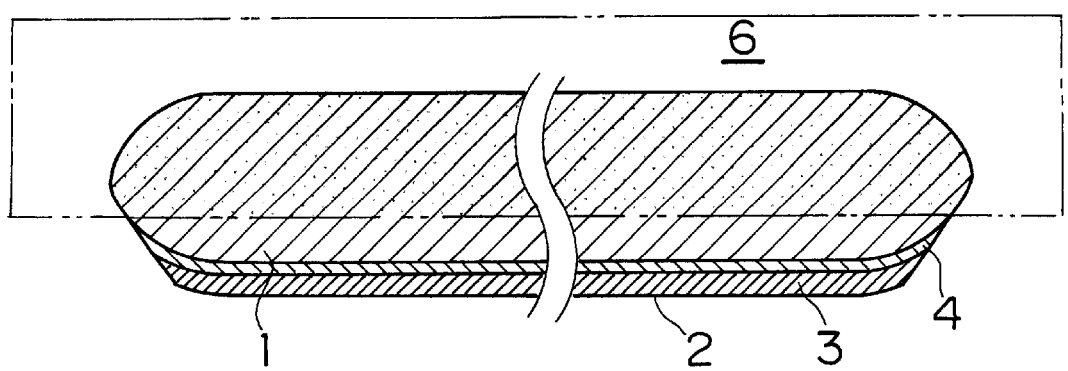
FIG. 2 is a schematic section view of the wafer showing a positional relationship between the cut protecting sheet and a removed portion when the reverse of the wafer is ground.

Hereunder a preferred embodiment will be described of the method for cutting the wafer protecting sheet of the present invention with reference to the accompanying drawings.

FIG. 1 is a sectional side view schematically showing a semiconductor wafer 1, on which a protecting sheet 2 is adhered and cut in a cutting method according to an embodiment of the present invention. In FIG. 1, the wafer 1 is mounted and fixed with suction with the reverse down and the obverse, on which semiconductor devices have been formed, up on a stage of a protecting sheet adhering apparatus (not shown).

The protecting sheet 2 is composed of a plastic base 3 and an adhesive layer 4. The protecting sheet 2 is arranged over the wafer 1 with a side of the adhesive layer 4 down, and the protecting sheet 2 is pressed by an elastic body such as a roller and is thereby adhered on the obverse of the wafer 1. At this point, the protecting sheet 2 is adhered in such a manner that the protecting sheet 2 covers not only a level part of the obverse of the wafer 1 but also a chamfered inclined surface at the periphery of the wafer 1.

Then, a cutting tool 5 is put to the outer periphery of the wafer 1 and is inclined so that the cutting tool 5 and the level part of the obverse of the wafer 1 form a predetermined angle. The predetermined angle is calculated according to a form of the chamfered part of the wafer 1 and the finishing thickness of the wafer 1 so that the outer diameter of the protecting sheet 2 after being cut with the cutting tool 5 can be at least the diameter of the level part of the obverse of the wafer 1 as well as smaller than the outer diameter of the wafer 1. In this state, the cutting tool 5 is revolved around the central axis of the wafer 1, and the protecting sheet 2 is thereby cut along the outer periphery of the wafer 1. Thus, the protecting sheet 2 is cut in a required minimum size. The cut face and the level surface of the protecting sheet 2 form the predetermined angle, which is obtuse. Instead of revolving the cutting tool 5 in this process, the stage on which the wafer 1 is fixed may be rotated around the central axis of the wafer 1 while the cutting tool 5 is inclined and fixed.

FIG. 2 is a sectional view of the wafer 1 showing a positional relationship between the protecting sheet 2 and a removed portion 6 when the reverse of the wafer 1 is ground, of which the protecting sheet 2 has been cut in the above-described cutting method of the present embodiment. The wafer 1 is mounted and fixed with suction with the reverse up and the obverse, which is covered with the protecting sheet 2, down on a worktable of a back grinder (not shown). Then, the reverse of the wafer 1 is ground with a grindstone (not shown) and the portion 6 is thereby removed, so that the wafer 1 becomes a state shown in FIG. 3. In this process, the plastic base 3 and the adhesive layer 4 of the protecting sheet 2 exist only outside the removed portion 6 as shown in FIG. 2, and the plastic base 3 and the adhesive layer 4 are not ground while the reverse of the wafer 1 is ground. Thus, the grindstone is prevented from being clogged up with ground plastic and adhesive material.

Figure 3:
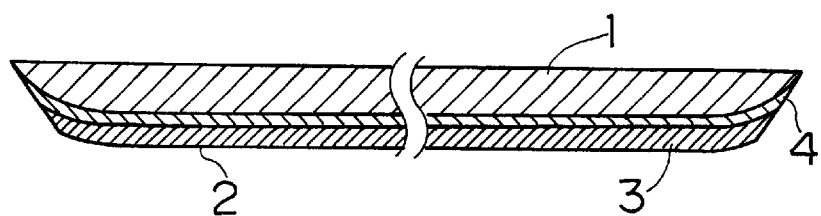
FIG. 3 is a schematic section view of the wafer with the protecting sheet after being ground.
Figure 4:
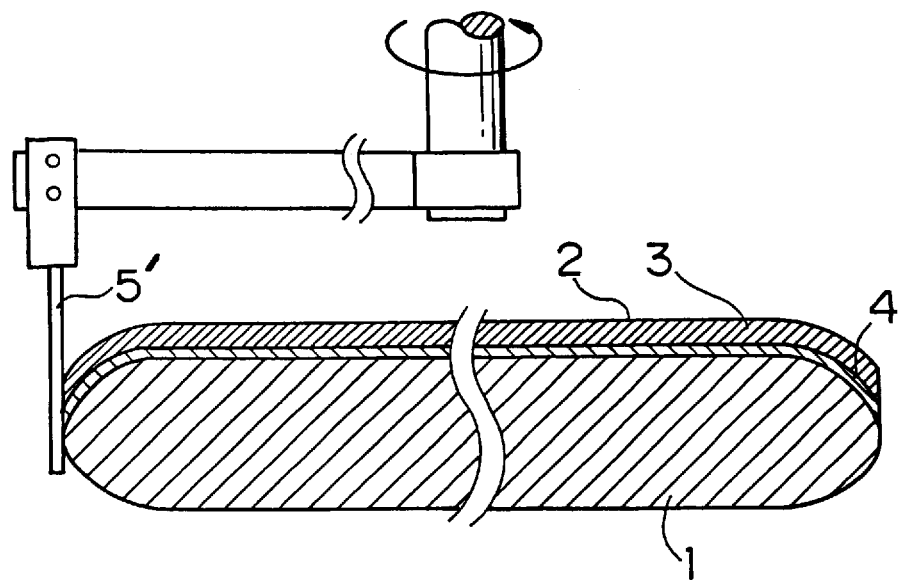
FIG. 4 is a schematic section view showing a semiconductor wafer, on which a protecting sheet is adhered and cut in a conventional cutting method.
Figure 5:
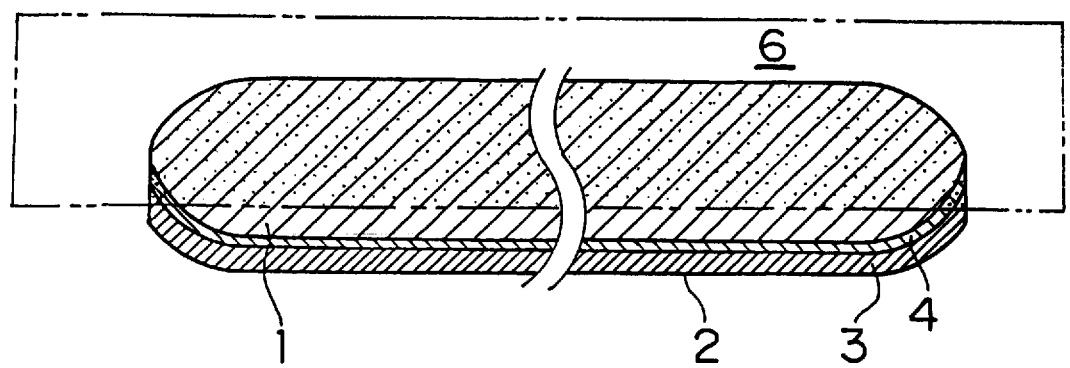
FIG. 5 is a schematic section view showing a positional relationship the conventionally cut protecting sheet and a removed portion when the reverse of the wafer is ground.
Figure 6:
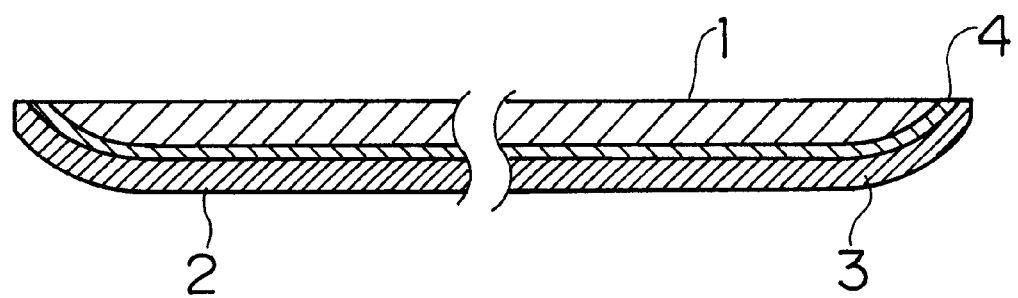
FIG. 6 is a schematic section view showing the wafer with the conventionally cut protecting sheet after being ground.

FIG. 3 is a sectional view of the wafer 1 of which reverse has been ground. A damaged layer, which is produced due to the grinding, of the reverse of the wafer 1 shown in FIG. 3 is eliminated by polishing, etching, or the like, and the wafer 1 is thereby finished to have the finishing thickness. The wafer 1 afterward goes through cleaning and drying processes, and is loaded on a dicing frame via a dicing sheet, then diced into separate devices with a dicing saw (not shown).

As described hereinabove, according to the method for cutting the wafer protecting sheet of the present invention, the protecting sheet is cut so as not to be included inside the removed portion in the grinding process of the reverse of the wafer even if the wafer is ground to have extremely thin finishing thickness. Hence, the protecting sheet is not ground while the reverse of the wafer is ground, and the grindstone is thus prevented from being clogged up with ground material of the protecting sheet.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method for cutting a protecting sheet of a wafer having a first face and a second face, wherein the first face has a level part, wherein a chamfered inclined surface is provided at a periphery of the wafer, and wherein the first face is substantially covered by the protecting sheet, the protective sheet extending over the chamfered inclined surface and the second face is to be subjected to backgrinding, comprising the step of:

cutting the protecting sheet so that a diameter of the protecting sheet is at least equal to a diameter of the level part of the first face and smaller than an outer diameter of the wafer, and removing the protecting sheet from at least part of the chamfered inclined surfaces wherein the step of cutting further comprising the step of: arranging a cutting tool at an inclined angle relative to the first face while cutting so that a cut face of the protecting sheet and the level surface of the first surface form an obtuse angle; and wherein the inclined angle of the cutting tool is adjusted according to a form of the chamfered part of the wafer and a finishing thickness of the wafer.

* * * * *